US012666645B2

(12) United States Patent
Choi et al.

(10) Patent No.: US 12,666,645 B2
(45) Date of Patent: Jun. 23, 2026

(54) THIN FILM TRANSISTOR SUBSTRATE AND DISPLAY APPARATUS COMPRISING THE SAME

(71) Applicant: LG Display Co., Ltd., Seoul (KR)

(72) Inventors: Sungju Choi, Paju-si (KR); Jaeyoon Park, Paju-si (KR); JungSeok Seo, Paju-si (KR); Seoyeon Im, Paju-si (KR); Jinwon Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 354 days.

(21) Appl. No.: 18/226,067

(22) Filed: Jul. 25, 2023

(65) Prior Publication Data

US 2024/0047582 A1     Feb. 8, 2024

(30) Foreign Application Priority Data

Aug. 8, 2022    (KR) ........................ 10-2022-0098646

(51) Int. Cl.
| | |
|---|---|
| *H01L 29/786* | (2006.01) |
| *H01L 29/417* | (2006.01) |
| *H10D 30/67* | (2025.01) |
| *H10K 59/121* | (2023.01) |
| *H10K 59/126* | (2023.01) |

(52) U.S. Cl.
CPC ..... *H10D 30/6723* (2025.01); *H10D 30/6729* (2025.01); *H10D 30/6757* (2025.01); *H10K 59/1213* (2023.02); *H10K 59/126* (2023.02)

(58) Field of Classification Search
CPC ........ H10D 86/40; H10D 86/60; H10D 86/00; H10D 86/441; H10D 86/451; H10D 30/6723; H10D 30/67; H10D 30/6729; H10D 30/6757; H10D 30/6708; H10D 30/6715; H10D 30/673; H10D 86/45; H10K 59/121; H10K 59/126; H10K 59/12; H10K 59/1213; H10K 59/123
See application file for complete search history.

(56) References Cited

U.S. PATENT DOCUMENTS

| | | | |
|---|---|---|---|
| 9,455,280 B2 * | 9/2016 | Yamazaki | ............ H10D 86/423 |
| 2014/0070209 A1 * | 3/2014 | Yamazaki | .............. H10D 86/60 |
| | | | 257/43 |
| 2022/0190170 A1 | 6/2022 | Lee et al. | |

(Continued)

FOREIGN PATENT DOCUMENTS

| | | |
|---|---|---|
| DE | 10 2019 129 838 A1 | 5/2020 |
| KR | 10-2005-0031986 A | 4/2005 |

(Continued)

*Primary Examiner* — Nikolay K Yushin
(74) *Attorney, Agent, or Firm* — Birch, Stewart, Kolasch & Birch, LLP

(57)     ABSTRACT

Discussed is a thin film transistor and a display apparatus. The thin film transistor can include a light shielding layer disposed on the substrate and formed of, or include conductive materials, an active layer disposed on the light shielding layer and overlapping the light shielding layer, a source electrode connected to a first side of the active layer and the light shielding layer, a drain electrode connected to a second side of the active layer, a gate electrode overlapping the active layer, and a connection layer disposed between the light shielding layer and the active layer, and electrically connecting the light shielding layer with the active layer.

20 Claims, 18 Drawing Sheets

(56) References Cited

U.S. PATENT DOCUMENTS

2023/0140193 A1* 5/2023 Choi ................. H10K 59/1213
257/288
2024/0088300 A1* 3/2024 Liu ..................... H10D 86/423

FOREIGN PATENT DOCUMENTS

| KR | 10-2019-0080389 A | 7/2019 |
| KR | 10-2020-0079894 A | 7/2020 |

* cited by examiner

LS

110

120

110

LS ch

120

110

LS

LS    CL

LS    CL

LS    CL    A1

LS   CL   A1

130

120

110

LS        CL        Aln  Ala

Alb

A1

130

120

110

THIN FILM TRANSISTOR SUBSTRATE AND DISPLAY APPARATUS COMPRISING THE SAME

CROSS-REFERENCE TO RELATED APPLICATIONS

This application claims priority to the Korean Patent Application No. 10-2022-0098646 filed in the Republic of Korea on Aug. 8, 2022, the entire contents of which are hereby expressly incorporated by reference into the present application.

BACKGROUND OF THE DISCLOSURE

Field

The present disclosure relates to a thin film transistor substrate and a display apparatus comprising the same.

Discussion of the Related Art

Since a thin film transistor can be manufactured on a glass substrate or a plastic substrate, it is widely used as a switching element or a driving element of a display apparatus such as a liquid crystal display apparatus or an organic light emitting device.

In general, it can be advantageous for switching thin film transistors used in many displays to have a large on-current to improve on-off characteristics, and for driving thin film transistors used in the many displays, and it can be advantageous to have a large S-factor for better gray scale expression.

However, the on-current and the S-factor generally have a trade-off relationship that is inverse to each other, where when the on-current is increased, the S-factor becomes smaller, and when the S-factor is increased, the on-current tends to become smaller.

SUMMARY OF THE DISCLOSURE

Therefore, it is difficult to obtain a thin film transistor having a large S-factor with an improved on-current.

The present disclosure has been made in view of the above problems, and it is an object of the present disclosure to provide a thin film transistor substrate and a display apparatus comprising the same, which can improve on-current while having a large S-factor.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

In accordance with an aspect of the present disclosure, the above and other objects can be accomplished by the provision of a thin film transistor substrate comprising a substrate; a light shielding layer disposed on the substrate, made of conductive material; an active layer disposed on the light shielding layer and overlapping the light shielding layer; a source electrode connected to a first side of the active layer and the light shielding layer; a drain electrode connected to a second side of the active layer; a gate electrode overlapping the active layer; and a connection layer disposed between the light shielding layer and the active layer and connecting electrically the light shielding layer with the active layer.

In accordance with an aspect of the present disclosure, a thin film transistor substrate comprising a substrate; an active layer disposed on the substrate; a source electrode connected to a first side of the active layer; a drain electrode connected to a second side of the active layer; and a gate electrode overlapping the active layer, wherein a path of electrons moving from the source electrode to the drain electrode includes a first path from the source electrode to the drain electrode via the active layer and a second path from the source electrode to the drain electrode through the active layer via a third part.

In accordance with an aspect of the present disclosure, a display apparatus comprising a substrate; a driving thin film transistor and a switching thin film transistor; a first electrode connected to the driving thin film transistor; a light emitting layer disposed on the first electrode; and a second electrode disposed on the light emitting layer; wherein the driving thin film transistor includes a light shielding layer disposed on the substrate and made of conductive material, an active layer disposed on the light shielding layer and overlapping the light shielding layer, a source electrode connected to a first side of the active layer and connected to the light shielding layer, a drain electrode connected to a second side of the active layer; a gate electrode overlapping the active layer; and a connection layer disposed between the light shielding layer and the active layer and connecting electrically the light shielding layer with the active layer.

Other systems, methods, features and advantages will be or will become apparent to one with skill in the art upon examination of the following figures and detailed description. It is intended that all such additional systems, methods, features and advantages be included within this description, be within the scope of the present disclosure, and be protected by the following claims, nothing in this section should be taken as a limitation on those claims. Further aspects and advantages are discussed below in conjunction with embodiments of the disclosure. It is to be understood that both the foregoing general description and the following detailed description of the present disclosure are by example and explanatory and are intended to provide further explanation of the inventive concept and the disclosure as claimed.

BRIEF DESCRIPTION OF THE DRAWINGS

The above and other objects, features and other advantages of the present disclosure will be more clearly understood from the following detailed description taken in conjunction with the accompanying drawings, in which.

Figure 1:
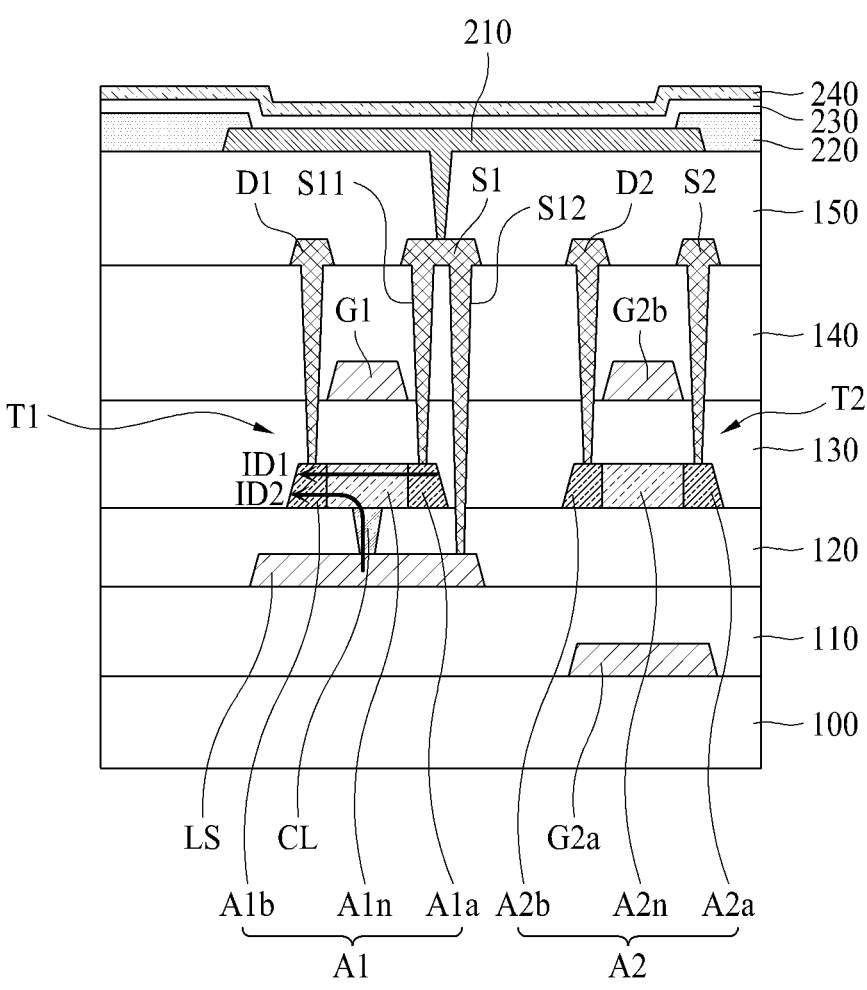
FIG. 1 is a cross-sectional view of a display apparatus according to an embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "over," "under," "beneath", and "next," the case of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Further, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Further, a source region can be a drain electrode, and a drain region can be a source electrode. All the components of each display apparatus according to all embodiments of the present disclosure are operationally coupled and configured.

FIG. 1 is a cross-sectional view of a display apparatus according to an embodiment of the present disclosure.

As shown in FIG. 1, the display apparatus in accordance with an embodiment of present disclosure includes a substrate 100, first to fifth insulating layers 110, 120, 130, 140, 150, a first thin film transistor T1 including a first active layer A1, a first gate electrode G1, a first source electrode S1 and a first drain electrode D1, a second thin film transistor T2 including a second active layer A2, a second gate electrode G2a, G2b, a second source electrode S2, and a second drain electrode D2; a first electrode 210, a bank 220; a light emission layer 230; and a second electrode 240.

The first thin film transistor T1 can be formed of, or include a driving transistor, and the second thin film transistor T2 can be formed of, or include a switching transistor.

The substrate 100 can be made of, or include glass or plastic. In particular, the substrate 100 can be made of, or include a transparent plastic having flexible properties, for example, polyimide. When polyimide is used as the substrate 100, considering that a high-temperature deposition process is performed on the substrate 100, a heat-resistant polyimide capable of enduring high temperatures can be used.

A lower second gate electrode G2a of the second thin film transistor T2 is provided on the substrate 100. The lower second gate electrode G2a constitutes a double second gate electrode G2a and G2b together with the upper second gate electrode G2b. However, the present disclosure is not necessarily limited thereto, and the lower second gate electrode G2a can be omitted. Further, the formation position of the lower second gate electrode G2a can be changed, for example, the lower second gate electrode G2a can be formed on the same layer as the light shielding layer LS on the first insulating layer 110.

A first insulating layer 110 is provided on the lower second gate electrode G2a. The first insulating layer 110 can protect the first active layer A1 and the second active layer A2 by blocking air and moisture. The first insulating layer 110 can be made of, or include an inorganic insulating material such as silicon oxide, silicon nitride, or metal oxide, but is not limited thereto and can be made of, or include an organic insulating material. The first insulating layer 110 can be formed of, or include a single layer or a plurality of layers.

A light shielding layer LS is provided on the first insulating layer 110.

The light shielding layer LS is provided to overlap the first active layer A1 of the first thin film transistor T1 to prevent external light from entering the first active layer A1. The light shielding layer LS is made of, or include a conductive material having excellent electrical conductivity. The light shielding layer LS can have a larger area than that of the first active layer A1.

The light shielding layer LS can be electrically connected to the first source electrode S1 to adjust the S-factor of the first thin film transistor T1. In addition, the light shielding layer LS can be electrically connected to the first active layer A1 through the connection layer CL to improve on-current Ion and heat emission characteristics of the first thin film transistor T1. Such S-factor, on-current, and heat emission characteristics will be described later.

A separate light shielding layer can be additionally formed on the first insulating layer 110 to overlap the second active layer A2 of the second thin film transistor T2 while being spaced apart from the light shielding layer LS.

A second insulating layer 120 is provided on the light shielding layer LS. The second insulating layer 120 can protect the first active layer A1 and the second active layer A2 by blocking air and moisture. The second insulating layer 120 can be formed of, or include an inorganic insulating material such as silicon oxide, silicon nitride, or metal oxide, but is not limited thereto and can be formed of, or include an organic insulating material. The second insulating layer 120 can be formed of, or include a single layer or a plurality of layers. The second insulating layer 120 can function as a buffer layer between the light shielding layer LS and the first active layer A1 to adjust the S-factor of the first thin film transistor T1, which will be described later.

The first active layer A1 and the second active layer A2 are provided on the second insulating layer 120.

The first active layer A1 can include a channel part (or channel) A1n, a first connection part A1a, and a second connection part A1b. The first connection part A1a can be connected to one side of the channel part A1n, and the second connection part A1b can be connected to the other side of the channel part A1n. The channel part A1n can be made of, or include a semiconductor material and can overlap the first gate electrode G1 to be protected by the first gate electrode G1. The first connection part A1a and the second connection part A1b can have conductive characteristics by selectively conducting a semiconductor material. The first connection part A1a and the second connection part A1b can be formed to not overlap the first gate electrode G1. The first connection part A1a and the second connection part A1b have better conductivity than the channel part A1n, and each of them can serve as a wiring or a source/drain electrode.

The second active layer A2 can include a channel part A2n, a first connection part A2a, and a second connection part A2b. The first connection part A2a can be connected to one side of the channel part A2n, and the second connection part A2b can be connected to the other side of the channel part A2n. The channel part A2n can be made of, or include a semiconductor material and can overlap the upper second gate electrode G2b to be protected by the upper second gate electrode G2b. The first connection part A2a and the second connection part A2b can have conductive characteristics by selectively making a semiconductor material to conduct. The first connection part A2a and the second connection part A2b can be formed to not overlap the upper second gate electrode G2b. The first connection part A2a and the second connection part A2b have better conductivity than the channel part A2n, and each of them can serve as a wiring or a source/drain electrode.

The first active layer A1 is electrically connected to the light shielding layer LS through a connection layer CL provided in the contact hole of the second insulating layer 120. The second active layer A2 can be connected to a separate light shielding layer through a separate connection layer provided in the contact hole of the second insulating layer 120.

A third insulating layer 130 is provided on the first active layer A1 and the second active layer A2. The third insulating layer 130 insulates the first active layer A1 from the first gate electrode G1 and also insulates the second active layer A2 from the upper second gate electrode G2b. Accordingly, the third insulating layer 130 functions as a gate insulating layer for insulating between the gate electrodes G1, G2a, and G2b and the active layers A1 and A2. The third insulating layer 130 can include a single layer or a plurality of layers including an inorganic insulating material and/or an organic insulating material.

A first gate electrode G1 of the first thin film transistor T1 and the upper second gate electrode G2b of the second thin film transistor T2 are provided on the third insulating layer 130.

The first gate electrode G1 overlaps the first active layer A1, and the upper second gate electrode G2b overlaps the second active layer A2. The first gate electrode G1 and the upper second gate electrode G2b can be formed of, or include the same material in the same layer through the same process.

A fourth insulating layer 140 is provided on the first gate electrode G1 and the upper second gate electrode G2b. The fourth insulating layer 140 can include a single layer or a plurality of layers including an inorganic insulating material and/or an organic insulating material.

A first source electrode S1 and a first drain electrode D1 of the first thin film transistor T1, and a second source electrode S2 and a second drain electrode D2 of the second thin film transistor T2 are provided on the fourth insulating layer 140.

The first source electrode S1 of the first thin film transistor T1 is electrically connected to the first active layer A1, in particular, the first connection part A1a, and is also electrically connected to the light shielding layer LS. Specifically, the first source electrode S1 can include a first part S11 and a second part S12, and the first part S11 is electrically connected to the first connection part A1a of the first active layer A1 through a contact hole provided in the third to fourth insulating layers 130 and 140, and the second part S12 is electrically connected to the light shielding layer LS through a contact hole provided in the second to fourth insulating layer 120 to 140. Accordingly, the first source electrode S1 can function as a connection electrode electrically connecting the first active layer A1 with the light shielding layer LS. In various embodiments of the present disclosure, the first part S11 and a second part S12 of the source electrode S1 need not be separated throughout its transit through the third and fourth insulating layers 130 and 140. Some or all of the first part S11 and a second part S12 can be combined in the third and fourth insulating layers 130 and 140, and when entirely combined, a single part can be provided to connect the first electrode 210 to the first connection part A1a and/or the light shielding layer LS.

The first drain electrode D1 of the first thin film transistor T1 is electrically connected to the first active layer A1, in particular, the second connection part A1b. Specifically, the first drain electrode D1 is electrically connected to the second connection part A1b of the first active layer A1 through a contact hole provided in the third to fourth insulating layers 130 and 140.

The second source electrode S2 of the second thin film transistor T2 is electrically connected to the second active layer A2, in particular, the first connection part A2a. Specifically, the second source electrode S2 is electrically connected to the first connection part A2a of the second active layer A2 through a contact hole provided in the third to fourth insulating layers 130 and 140. Similar to the first source electrode S1, the second source electrode S2 can connect the second active layer A2 to a separate light shielding layer.

The second drain electrode D2 of the second thin film transistor T2 is electrically connected to the second active layer A2, in particular, the second connection part A2b. Specifically, the second drain electrode D2 is electrically connected to the second connection part A2b of the second active layer A2 through a contact hole provided in the third to fourth insulating layers 130 and 140.

The first drain electrode D1 of the first thin film transistor T1 is electrically connected to a high source VDD line, the second drain electrode D2 of the second thin film transistor T2 is electrically connected to the first gate electrode G1 of the first thin film transistor T1, the second source electrode S2 is electrically connected to a data line, and the second gate electrode G2a, G2b can be electrically connected to a gate line.

A fifth insulating layer 150 is provided on the first source electrode S1, the first drain electrode D1, the second source electrode S2, and the second drain electrode D2. The fifth insulating layer 150 can include a single layer or a plurality of layers including an inorganic insulating material and/or an organic insulating material. The fifth insulating layer 150 can function as a planarization layer.

A first electrode 210 is provided on the fifth insulating layer 150.

The first electrode 210 is connected to the first source electrode S1 through a contact hole provided in the fifth insulating layer 150. The first electrode 210 can function as an anode.

The bank 220 is provided to cover an edge of the first electrode 210 to define a light emitting area. Accordingly, an upper surface area of the first electrode 210 exposed without being covered by the bank 220 becomes a light emitting area.

The light emitting layer 230 is provided on the first electrode 210 and the bank 220. The light emitting layer 230 can include at least one of red, green, and blue emission layers patterned for each pixel, or can be formed of, or include a white emission layer connected to all pixels. When the light emitting layer 230 is formed of, or include a white light emitting layer, the light emitting layer 230 can include, for example, a first stack including a blue light emitting layer, a second stack including a yellow green light emitting layer, and a charge generation layer provided between the first stack and the second stack, but is not limited thereto. When the light emitting layer 230 is formed of, or include a white light emitting layer, a color filter can be provided for each pixel.

The second electrode 240 is provided on the light emitting layer 230. The second electrode 240 can function as a cathode.

An encapsulation layer for preventing moisture or oxygen from penetrating can be additionally formed on the second electrode 240.

According to an embodiment of the present disclosure, the cross-sectional structure of the second thin film transistor T2, which is a switching thin film transistor, can be different from the cross-sectional structure of the first thin film transistor T1, which is a driving thin film transistor. Particularly, a portion of a lower surface of the first active layer A1 of the first thin film transistor T1 contacts the connection layer CL, and the other portion of the lower surface of the first active layer A1 contacts the second insulating layer 120 which is a buffer layer, but the second thin film transistor T2 does not have the connection layer CL, and thus the entire lower surface of the second active layer A2 of the second thin film transistor can be in contact with the second insulation layer 120 which is a buffer layer.

According to an embodiment of the present disclosure, the first thin film transistor T1 can have an S-factor larger than that of the second thin film transistor T2, which will be described below.

The sub-threshold swing (i.e., S-factor) can be used as an indicator of the degree of change of the drain-source current IDS with respect to the gate voltage VGS in the threshold voltage Vth section of the thin film transistors T1 and T2.

Such an S-factor is obtained as the reciprocal value of the slope of the graph in the threshold voltage Vth section in the drain-source current graph for the gate voltage of the thin film transistors T1 and T2. Therefore, when the S-factor increases, the drain-source current change rate for the gate voltage becomes gentle in the threshold voltage Vth section, and when the S-factor decreases, the drain-source current change rate for the gate voltage in the threshold voltage Vth section increases rapidly. In other words, when the slope of the drain-source current graph is large, the S-factor is small, and when the slope of the drain-source current graph is small, the S-factor is large.

When the S-factor is increased, the drain-source current change rate with respect to the gate voltage becomes gentle in the threshold voltage Vth section, and thus it is easy to adjust the magnitude of the drain-source current through the adjustment of the gate voltage. In a current-driven display apparatus, for example, an organic light emitting display apparatus, the gray scale of a pixel can be controlled by adjusting the magnitude of the drain-source current of the driving thin film transistor. In this case, the magnitude of the drain-source current of the driving thin film transistor is determined by the gate voltage. Therefore, in an organic light emitting display apparatus driven by current, it is easier to adjust the gray scale of the pixel as the S-factor of the driving thin film transistor TFT increases.

According to an embodiment of the present disclosure, since the light shielding layer LS connected to the first source electrode S1 overlaps the first active layer A1, when the same voltage as the first source electrode S1 is applied to the light shielding layer LS, the light shielding layer LS can electrically affect the first active layer. Specifically, due to an electrical influence by the light shielding layer LS, an electric field applied to the first active layer A1 by the first gate electrode G1 can be reduced. As a result, the S-factor of the first thin film transistor T1 including the light-shielding layer LS can be larger than the S-factor of the second thin film transistor T2 not including the light-shielding layer LS.

As described above, the effect of the light shielding layer LS on the S-factor of the first thin film transistor T1 will be described below with reference to FIGS. 2A, 2B, 3A, and 3B.

Figure 2A:
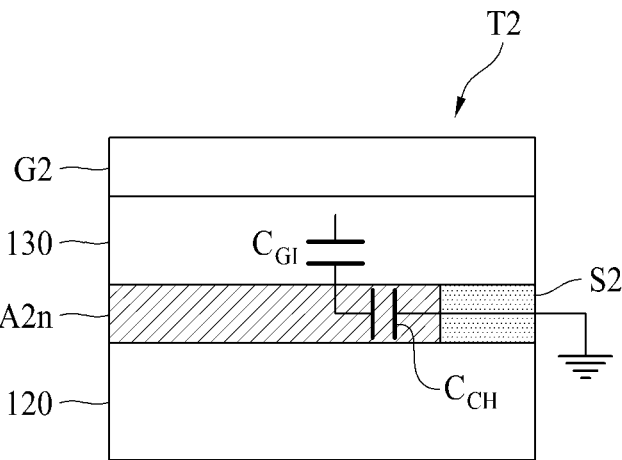
FIGS. 2A and 2B are schematic diagrams illustrating an effective gate voltage Veff of a second thin film transistor without a light shielding layer according to an embodiment of the present disclosure.
Figure 2B:
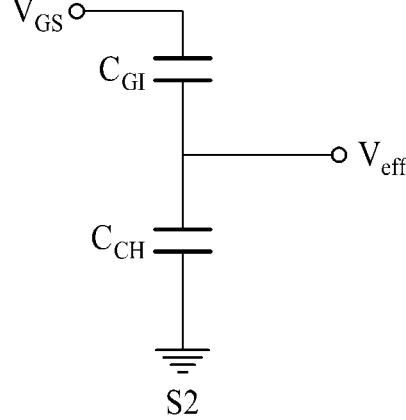

FIGS. 2A and 2B are schematic diagrams illustrating an effective gate voltage Veff of the second thin film transistor T2 without a light shielding layer in accordance with an embodiment of present disclosure.

FIG. 2A schematically illustrates capacitance Cap that can be generated when a gate voltage VGS is applied to the second thin film transistor T2. FIG. 2A schematically describes the capacitance Cap at the voltage near the threshold voltage Vth before the second thin film transistor T2 is completely turned on. Here, the gate voltage VGS is a voltage between the second source electrode S2 and the second gate electrode G2.

As illustrated in FIG. 2A, when a gate voltage VGS is applied to the second thin film transistor T2, a capacitance CGI can be formed between the channel part A2$n$ of the second active layer A2 and the second gate electrode G2, and a capacitance CCH can also be formed between the channel part A2$n$ and the second source electrode S2.

FIG. 2B schematically illustrates a relationship between capacitance Cap and voltage according to FIG. 2A.

Referring to FIG. 2B, due to the capacitance CCH between the channel part A2$n$ of the second active layer A2 and the second source electrode S2, the gate voltage VGS applied between the second source electrode S2 and the second gate electrode G2 is not applied between the channel part A2$n$ of the second active layer A2 and the second gate electrode G2, and voltage loss can occur.

When the second thin film transistor T2 is driven, when the voltage applied between the channel part A2$n$ and the second gate electrode G2 is referred to as the effective gate voltage Veff, the effective gate voltage Veff can be obtained by Equation 1.

$$Veff=[CGI/(CGI+CCH)]\times VGS \qquad \text{[Equation 1]}$$

Figure 3A:
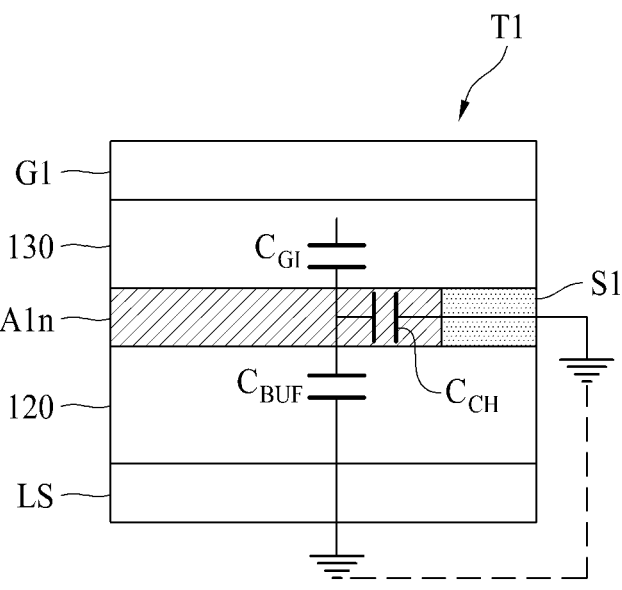
FIGS. 3A and 3B are schematic diagrams illustrating an effective gate voltage Veff of a first thin film transistor including a light shielding layer according to an embodiment of the present disclosure.
Figure 3B:
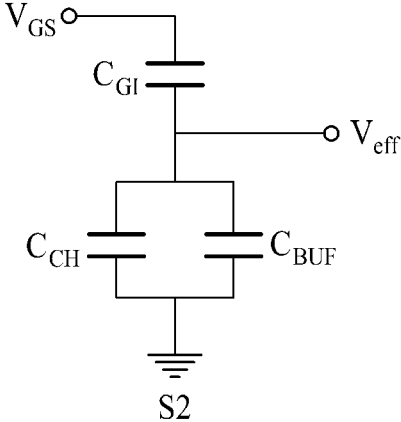

FIGS. 3A and 3B are schematic diagrams illustrating an effective gate voltage Veff of a first thin film transistor T1 provided with a light shielding layer according to an embodiment of the present disclosure.

FIG. 3A schematically illustrates capacitance Cap that can be generated when a gate voltage VGS is applied to the first thin film transistor T1. FIG. 3A schematically describes the capacitance Cap at a voltage near the threshold voltage Vth before the first thin film transistor T1 is completely turned on. Here, the gate voltage VGS is a voltage between the first source electrode S1 and the first gate electrode G1.

As shown in FIG. 3A, when a gate voltage VGS is applied to the first thin film transistor T1, a capacitance CGI is formed between the channel part A1$n$ of the first active layer A1 and the first gate electrode G1, and a capacitance CCH is also formed between the channel part A1$n$ of the first active layer A1 and the first source electrode S1, and additionally, a capacitance CBUF is formed between the channel part A1$n$ of the active layer A1 and the light shielding layer LS.

FIG. 3B schematically illustrates a relationship between capacitance Cap and voltage according to FIG. 3A.

Referring to FIG. 3B, due to the capacitance CCH between the channel part A1$n$ of the first active layer A1 and the first source electrode S1, and the capacitance CBUF between the channel part A1$n$ of the first active layer A1 and the light shielding layer LS, the gate voltage VGS applied between the first source electrode S1 and the first gate electrode G1 is not applied between the channel part A1$n$ of the first active layer A1 and the first gate electrode G1, and a voltage loss can occur.

According to an embodiment of present disclosure, since the light shielding layer LS and the first source electrode S1 are electrically connected, the capacitance CBUF is additionally generated between the channel part A1$n$ of the first active layer A1 and the light shielding layer LS, and the capacitance Cap of the first thin film transistor T1 in which the voltage loss occurs increases.

Therefore, when the voltage applied between the channel part A1$n$ of the first active layer A1 and the first gate electrode G1 is referred to as the effective gate voltage Veff when the first thin film transistor T1 is driven, the effective gate voltage Veff can be obtained by Equation 2.

$$Veff=[CGI/(CGI+CCH+CBUF)]\times VGS \qquad \text{[Equation 2]}$$

Referring to Equation 2, due to the capacitance CBUF between the channel part A1$n$ of the first active layer A1 and the light shielding layer LS, the denominator part of Equation 2 was increased than that of Equation 1. Accordingly, the reduction amount of the effective gate voltage Veff is increased compared to the gate voltage VGS actually applied between the first source electrode S1 and the first gate electrode G1. Therefore, when the same voltage is applied, the drain-source current IDS of the first thin film transistor T1 becomes smaller than the drain-source current IDS of the second thin film transistor T2, and the degree of change of the drain-source current IDS becomes smaller.

As described above, since the change in the drain-source current IDS of the first thin film transistor T1 is smaller than that of the second thin film transistor T2, the first thin film transistor T1 has an S-factor larger than that of the second thin film transistor T2.

Meanwhile, Equation 3 below shows on-current Ion characteristics, and Equation 4 below shows S-factor characteristics.

As can be seen from Equations 3 and 4 below, the on-current Ion is inversely proportional to CBUF and proportional to CGI, and the S-factor is proportional to CBUF and inversely proportional to CGI.

$$Ion \propto (1+CBUF/CGI)-1 \qquad \text{[Equation 3]}$$

$$S\text{-factor} \propto (1+CBUF/CGI) \qquad \text{[Equation 4]}$$

Therefore, in order to increase the S-factor, it is preferable to increase the CBUF or decrease the CGI, and in order to increase the on-current Ion, it is preferable to decrease the CBUF or increase the CGI.

The CBUF can be controlled by the second insulating layer 120 functioning as a buffer layer provided between the channel part A1$n$ of the first active layer A1 and the light shielding layer LS. Specifically, when the thickness of the second insulating layer 120 is large or the dielectric constant of the second insulating layer 120 is small, the CBUF becomes smaller, and when the thickness of the second insulating layer 120 is small or the dielectric constant of the second insulating layer 120 is large, the CBUF becomes larger.

The CGI can be controlled by the third insulating layer 130 functioning as a gate insulating layer provided between the channel part A1$n$ of the first active layer A1 and the first gate electrode G1. Specifically, when the thickness of the third insulating layer 130 is large or the dielectric constant of the third insulating layer 130 is small, the CGI becomes smaller, or when the thickness of the third insulating layer 130 is small or the dielectric constant of the third insulating layer 130 is large, the CGI becomes larger.

Therefore, for example, in order to increase the S-factor, CBUF can be increased by reducing the thickness of the second insulating layer 120 or CGI can be decreased by increasing the thickness of the third insulating layer 130. In addition, in order to increase the on-current Ion, the thickness of the second insulating layer 120 can be increased to reduce the CBUF, or the thickness of the third insulating layer 130 can be decreased to increase the CGI. By properly adjusting the thickness and dielectric constant of the second insulating layer 120 and the thickness and dielectric constant of the third insulating layer 130, the S-factor and on-current of the first thin film transistor T1 can be adjusted and the S-factor and on-current of the second thin film transistor T2 also can be adjusted. According to an embodiment of the present disclosure, the S-factor of the first thin film transistor T1 can be configured to be larger by configuring the thickness of the second insulating layer 120 to be thinner than the thickness of the third insulating layer 130.

As described above, since the on-current Ion and the S-factor have a trade-off relationship with each other, it is not easy to simultaneously improve the on-current Ion and S-factor characteristics in one thin film transistor T1 and T2.

According to an embodiment of the present disclosure, provided is a method for simultaneously improving characteristics of an S-factor and an on-current Ion by improving the on-current Ion without reducing the S-factor.

Referring back to FIG. 1, according to an embodiment of the present disclosure, the light shielding layer LS is electrically connected to the first active layer A1 through the connection layer CL. The connection layer CL is filled in a contact hole provided in the second insulating layer 120. Accordingly, the upper surface of the connection layer CL contacts the lower surface of the first active layer A1, and the lower surface of the connection layer CL contacts the upper surface of the light shielding layer LS.

As the light shielding layer LS and the first active layer A1 are electrically connected by the connection layer CL, there are two paths through which electrons move from the first source electrode S1 to the first drain electrode D1. Specifically, the path includes a first path ID1 moving from the first part S11 of the first source electrode S1 to the first drain electrode D1 through the first connection part A1a, the channel part A1$n$, and the second connection part A1b of the first active layer A1 in turn, and the second path ID2 moving from the second part S12 of the first source electrode S1 to the first drain electrode D1 through the light shielding layer LS, the connection layer CL, the channel part A1$n$ and the second connection part A1b of the first active layer A1 in turn via a third connection part A1c (see also FIGS. 18A and 18B).

In this way, by additionally configuring the second path ID2 by the connection layer CL, the on current Ion of the first thin film transistor T1 can be improved, and a large current can be secured at a low voltage, thereby reducing overheating problems caused by high voltage driving. In particular, according to an embodiment of the present disclosure, since the on current Ion of the first thin film transistor T1 can be improved through the connection layer CL regardless of the thickness and dielectric constant of the second and third insulating layers 120 and 130, both S-factor and on current Ion characteristics of the first thin film transistor T1 can be greatly improved.

In addition, according to an embodiment of the present disclosure, since the first active layer A1 is connected to the light shielding layer LS by the connection layer CL, heat generated during driving of the first thin film transistor T1 can be easily transferred from the first active layer A1 to the light shielding layer LS, so that the effect of dissipating heat can be improved.

The connection layer CL can be made of, or include the same material as the first active layer A1 or the same material as the light shielding layer LS.

The connection layer CL is not connected to the second connection part A1b of the first active layer A1. If the connection layer CL is connected to the second connection part A1b of the first active layer A1, a short can occur between the first source electrode S1 and the first drain electrode D1.

Figure 4A:
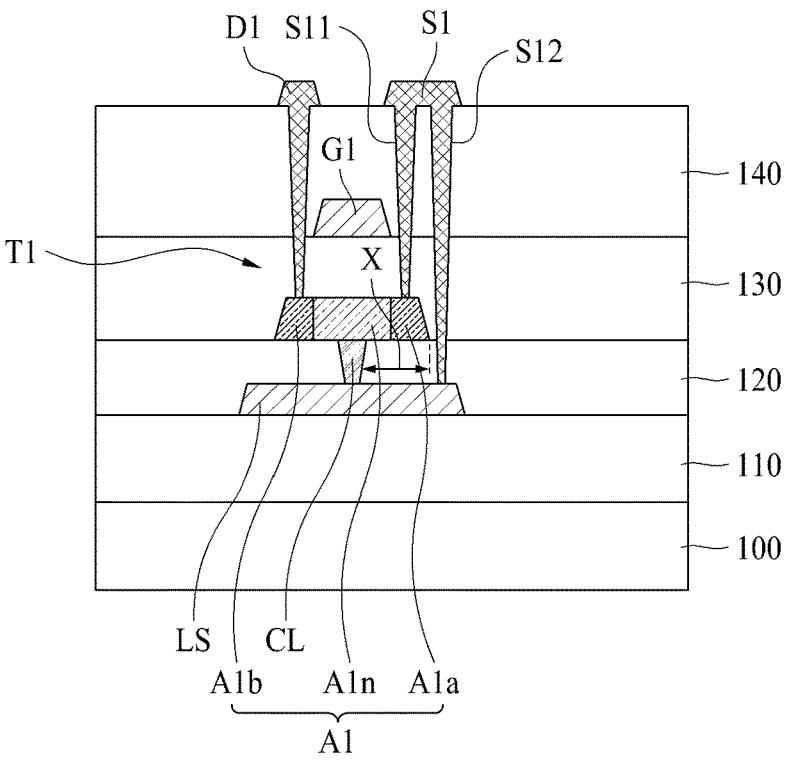
FIGS. 4A to 4C are cross-sectional views of a display apparatus according to various embodiments of the present disclosure.
Figure 4B:
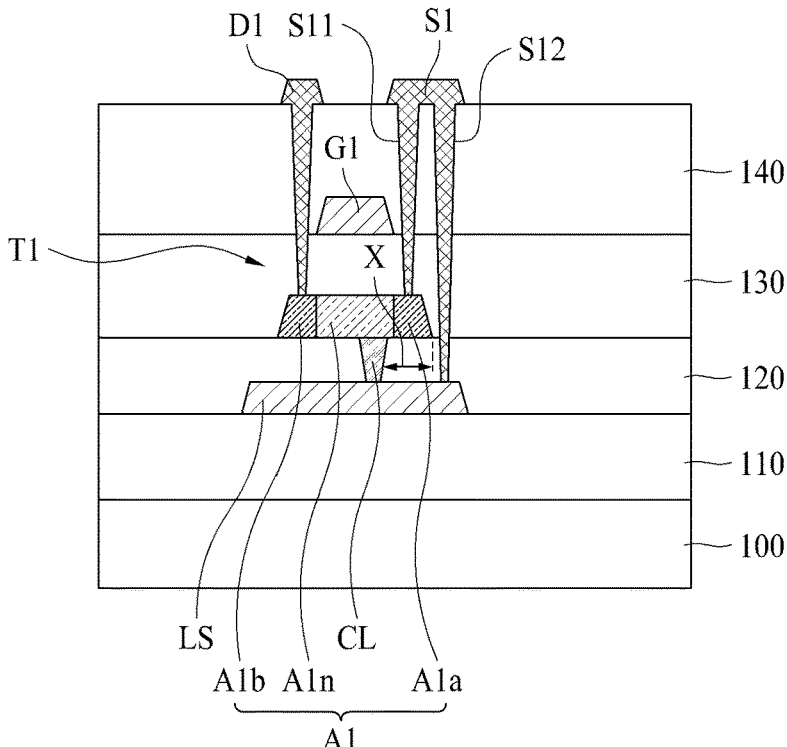
Figure 4C:
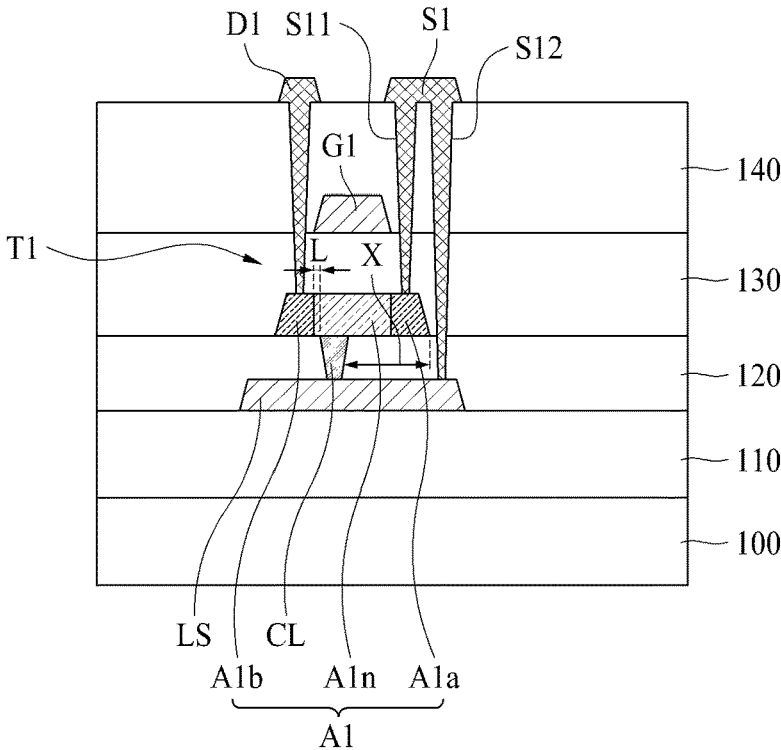

FIGS. 4A to 4C are cross-sectional views of a display apparatus according to various embodiments of the present disclosure, which illustrate only the first thin film transistor T1 in FIG. 1. The same is true in the following embodiments.

FIGS. 4A to 4C are variously changed the position of the connection layer CL, and specifically, the distance X between one end of the connection layer CL and one end of the first active layer A1, and particularly, one end of the first connection part A1a is variously changed.

In FIG. 4A, the connection layer CL is formed to overlap the center of the first active layer A1, for example, the center of the channel part A1n, the connection layer CL is moved toward the first connection part A1a of the first active layer A1, and in FIG. 4C, the connection layer CL is moved toward the second connection part A1b of the first active layer A1. Accordingly, X in FIG. 4C is the largest, and X in FIG. 4B is the smallest.

Figure 5:
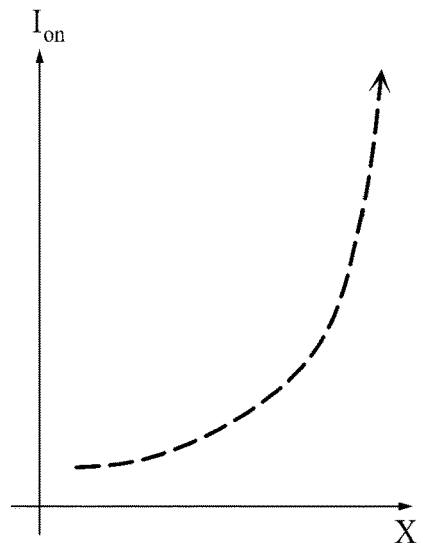
FIG. 5 is a graph showing a change in on-current Ion characteristics in accordance with a change in the distance X between one end of the connection layer and one end of the first connection part in FIGS. 4A to 4C.

FIG. 5 is a graph showing a change in on-current Ion characteristics according to a change in a distance X between one end of the connection layer CL and one end of the first connection part A1a in FIGS. 4A to 4C.

As shown in FIG. 5, it can be seen that as the distance X increases, on-current Ion characteristics are improved. For example, it can be seen that the on-current Ion characteristics of FIG. 4A are improved compared to the case of FIG. 4B, and the on-current Ion characteristics of FIG. 4C are improved compared to the case of FIG. 4A.

As shown in FIG. 4C, as the connection layer CL moves toward the second connection part A1b of the first active layer A1, an electron movement path between the connection layer CL and the first drain electrode D1 is shortened, thereby improving on current Ion characteristics.

Accordingly, it can be desirable for the connection layer CL to be disposed closer to the second connection part A1b than the first connection part A1a and closer to the first drain electrode D1 than the first source electrode S1 to improve on-current Ion characteristics. In addition, considering that hot spots mainly occur near the first drain electrode D1, it is advantageous for heat dissipation if the connection layer CL is disposed closer to the second connection part A1b than the first connection part A1a and closer to the first drain electrode D1 than the first source electrode S1.

However, as described above, when the connection layer CL contacts the second connection part A1b of the first active layer A1, a short can occur between the first source electrode S1 and the first drain electrode D1, and in FIG. 4C, the other end of the connection layer CL can be preferably spaced apart from one end of the second connection part A1b at a predetermined distance L, and the predetermined distance L can be 0.5 um or more but is not necessarily limited thereto.

Figure 6A:
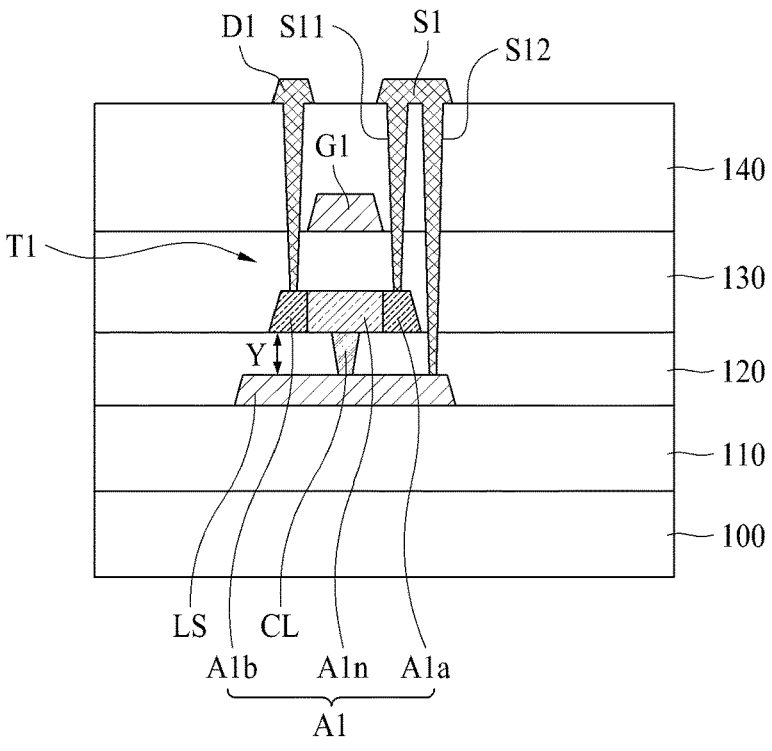
FIGS. 6A to 6C are cross-sectional views of a display apparatus according to various embodiments of the present disclosure.
Figure 6B:
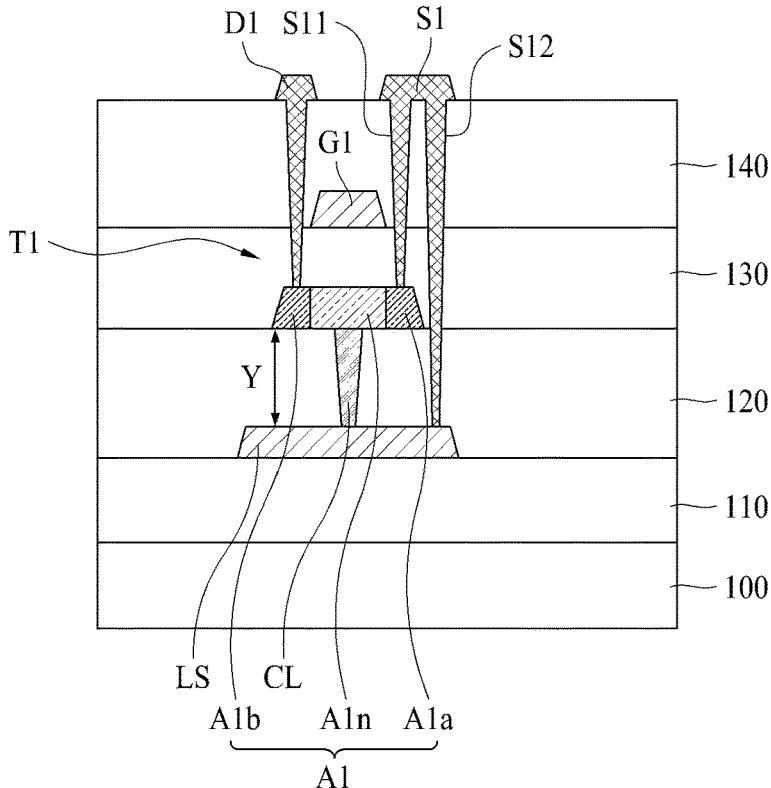
Figure 6C:
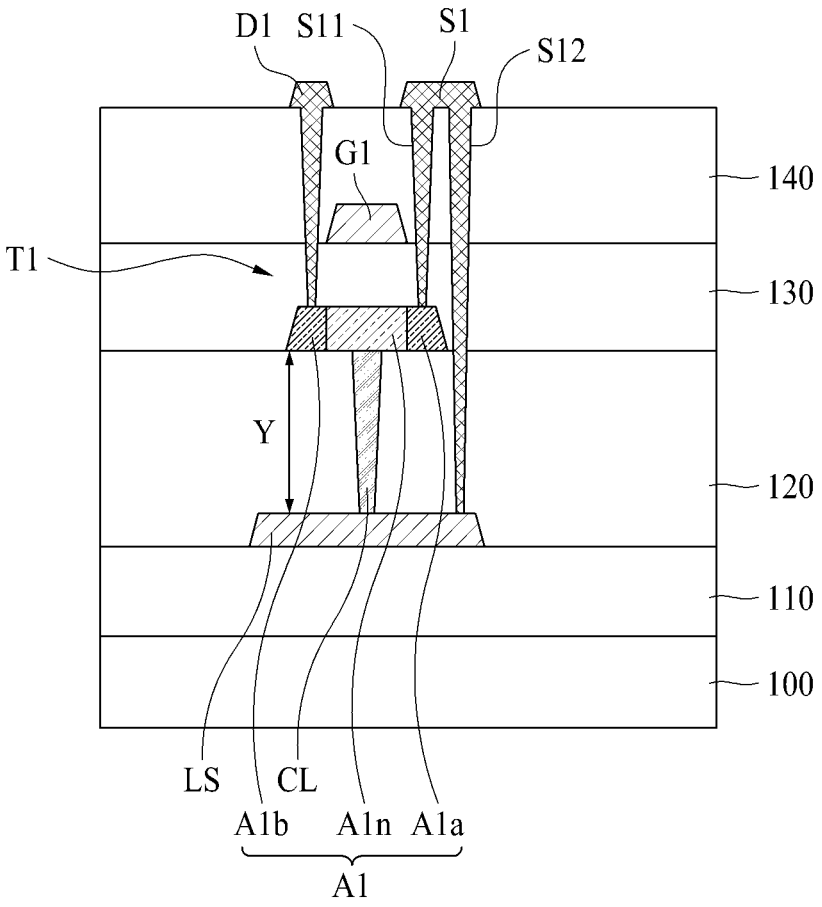

FIGS. 6A to 6C are cross-sectional views of a display apparatus according to various embodiments of the present disclosure.

FIGS. 6A to 6C are variably changed thickness Y of the second insulating layer 120, which is a buffer layer.

In FIG. 6A, the thickness Y of the second insulating layer 120 is the smallest, in FIG. 6C, the thickness Y of the second insulating layer 120 is the largest, and in FIG. 6B, the thickness Y of the second insulating layer 120 is the middle.

Figure 7:
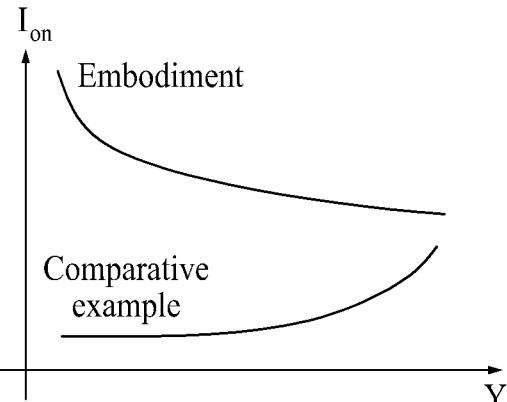
FIG. 7 is a graph showing a change in on-current Ion characteristics according to a change in a thickness Y of a second insulating layer in FIGS. 6A to 6C.

FIG. 7 is a graph showing a change in on-current Ion characteristics according to a change in thickness Y of the second insulating layer 120 in FIGS. 6A to 6C, and FIG. 8 is a graph showing a change in S-factor characteristics according to a change in thickness Y of the second insulating layer 120 in FIGS. 6A to 6C.

Figure 8:
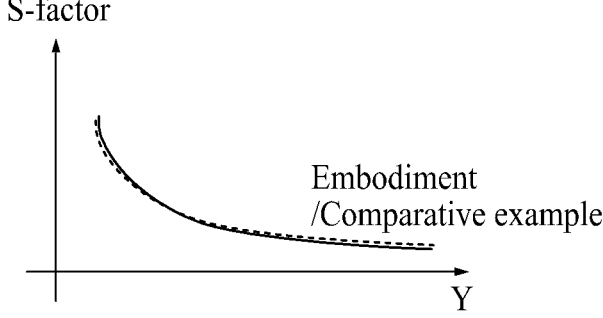
FIG. 8 is a graph showing a change in S-factor characteristics according to a change in thickness Y of the second insulating layer in FIGS. 6A to 6C.

In FIGS. 7 and 8, the comparative example corresponds to a case where the connection layer CL is not provided in FIGS. 6A to 6C, and the embodiment corresponds to a case where the connection layer CL is provided as shown in FIGS. 6A to 6C.

As illustrated in FIG. 7, as the thickness Y of the second insulating layer 120 increases, the on-current characteristics of the comparative example is improved. Meanwhile, the on-current characteristics of the embodiment is better than the on-current characteristics of the comparative example in specific thickness ranges. Also, it can be seen that the thickness Y of the second insulating layer 120 is preferably decreased in order to improve the on-current Ion characteristics of the embodiment.

As shown in FIG. 8, as the thickness Y of the second insulating layer 120 increases, the S-factor characteristics of both the comparative example and the embodiment are degraded. Accordingly, it can be seen that it is preferable to reduce the thickness Y of the second insulating layer 120 in order to improve the S-factor characteristics. According to an embodiment of the present disclosure, the S-factor of the first thin film transistor T1 can be configured to be larger by configuring the thickness of the second insulating layer 120 to be thinner than the thickness of the third insulating layer 130.

As shown in FIG. 8, it can be seen that the S-factor characteristics of the embodiment are almost the same as those of the comparative example, but as shown in FIG. 7, the on-current Ion characteristics of the embodiment are excellent as compared to the comparative example.

In the end, when the connection layer CL is provided, it can be found that the on-current Ion characteristics can be improved without degrading the S-factor characteristics compared to the case where the connection layer CL is not provided.

Figure 9:
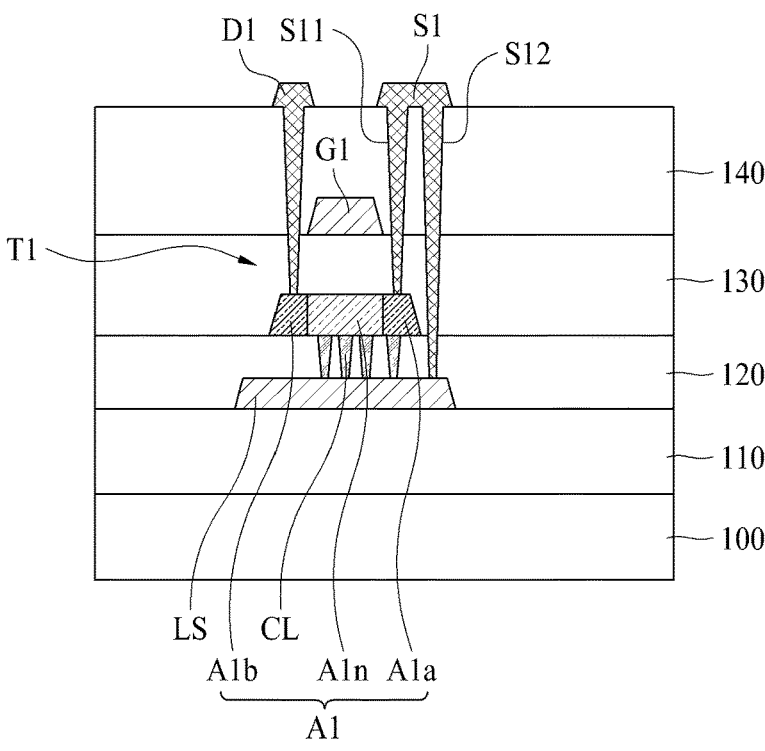
FIG. 9 is a cross-sectional view of a display apparatus according to another embodiment of the present disclosure.

FIG. 9 is a cross-sectional view of a display apparatus according to another embodiment of the present disclosure, wherein the configuration of the connection layer CL is changed in the first thin film transistor T1 of FIG. 1.

As shown in FIG. 9, a plurality of connection layers CL are spaced apart from each other at a predetermined distance, and each connection layer CL overlaps each of the first active layer A1 and the light shielding layer LS, and connects the first active layer A1 with the light shielding layer LS.

More specifically, at least one connection layer CL overlaps the channel part A1n of the first active layer A1 and the light shielding layer LS to connect the channel part A1n of the first active layer A1 with the light shielding layer LS. The at least one connection layer CL can be made of, or include the same material as the channel part A1n of the first active layer A1, or can be made of, or include the same material as the light shielding layer LS.

In addition, at least the other connection layer CL can connect the first connection part A1a of the first active layer A1 with the light shielding layer LS while overlapping each of the first connection part A1a of the first active layer A1 and the light shielding layer LS. The at least other connection layer CL can be formed of, or include the same material as the first connection part A1a of the first active layer A1, or can be formed of, or include the same material as the light shielding layer LS. However, it is not necessarily limited thereto. For example, all of the plurality of connection layers CL can connect the channel part A1n of the first active layer A1 with the light shielding layer LS.

Figure 10:
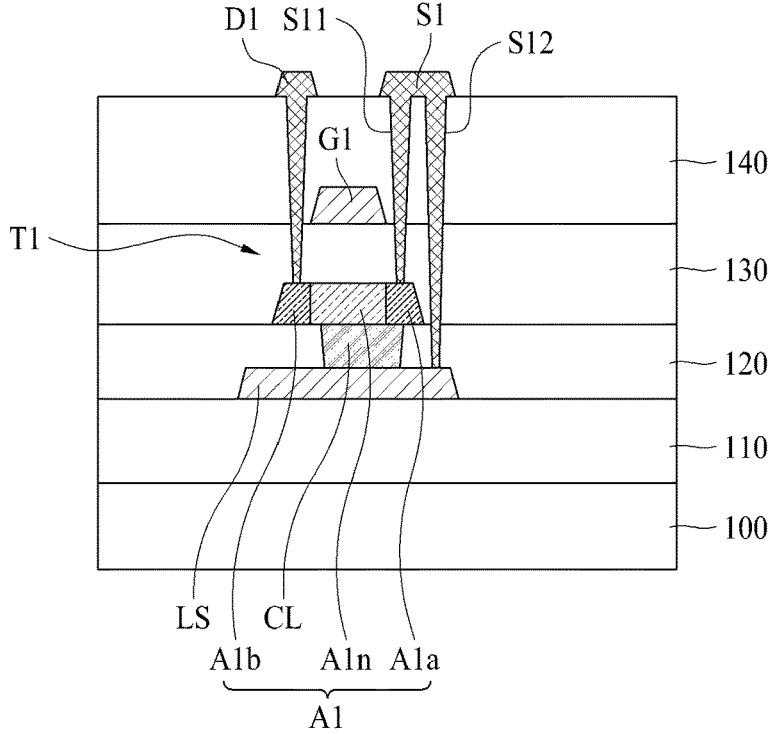
FIG. 10 is a cross-sectional view of a display apparatus according to another embodiment of the present disclosure.

FIG. 10 is a cross-sectional view of a display apparatus according to another embodiment of the present disclosure, wherein the configuration of the connection layer CL is changed in the first thin film transistor T1 of FIG. 1.

As shown in FIG. 10, one connection layer CL has a predetermined width and overlaps each of the first active layer A1 and the light shielding layer LS to connect the first active layer A1 with the light shielding layer LS.

More specifically, a portion of the one connection layer CL overlaps the channel part A1n of the first active layer A1 and the light shielding layer LS, and connects the channel part A1$n$ of the first active layer A1 with the light shielding layer LS. The portion of the one connection layer CL can be formed of, or include the same material as the channel part A1$n$ of the first active layer A1, or can be formed of, or include the same material as the light shielding layer LS.

The other portion of the one connection layer CL can connect the first connection part A1$a$ of the first active layer A1 with the light shielding layer LS while overlapping each of the first connection part A1$a$ of the first active layer A1 and the light shielding layer LS. The other portion of the one connection layer CL can be formed of, or include the same material as the first connection part A1$a$ of the first active layer A1, or can be formed of, or include the same material as the light shielding layer LS.

Figure 11:
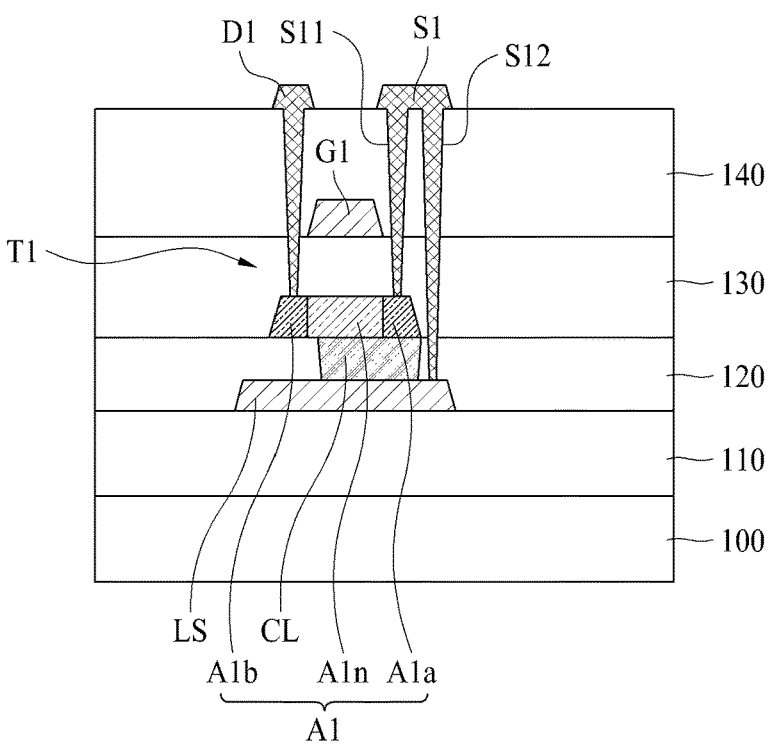
FIG. 11 is a cross-sectional view of a display apparatus according to another embodiment of the present disclosure.

FIG. 11 is a cross-sectional view of a display apparatus according to another embodiment of the present disclosure, wherein the width of the connection layer CL is different from that of FIG. 10 described above.

In the case of FIG. 10, another portion of one connection layer CL connecting the first connection part A1$a$ of the first active layer A1 with the light shielding layer LS overlaps a portion of the first connection part A1$a$.

On the other hand, in the case of FIG. 11, another portion of one connection layer CL connecting the first connection part A1$a$ of the first active layer A1 with the light shielding layer LS overlaps the entire portion of the first connection part A1$a$.

Therefore, as shown in FIG. 11, one end of the connection layer CL can coincide with one end of the first connection part A1$a$ of the first active layer A1. In FIG. 11, the movement path of electrons is wider than that of electrons in FIG. 10, so that the on-current Ion characteristics of FIG. 11 can be superior to the on-current Ion characteristics of FIG. 10.

Figure 12:
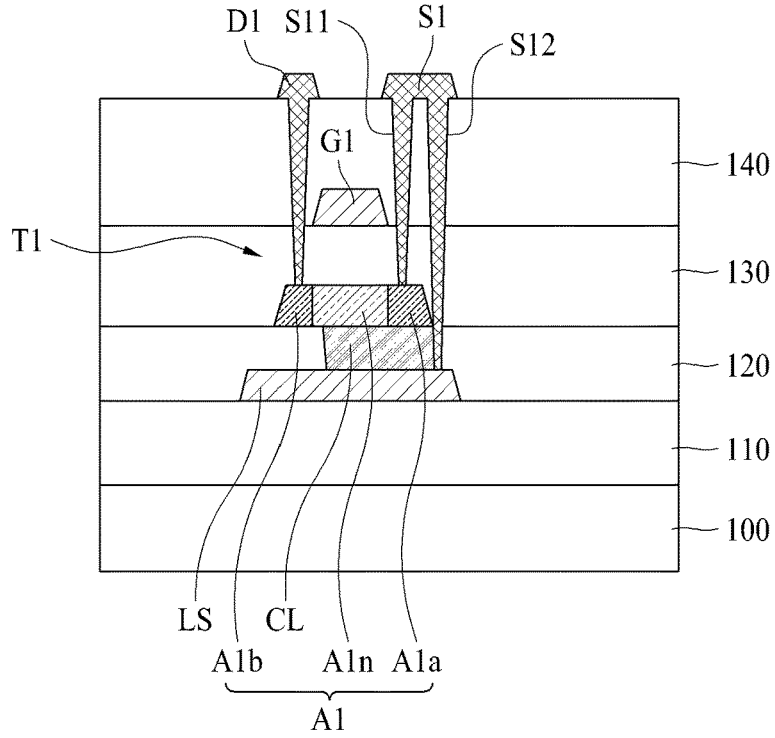
FIG. 12 is a cross-sectional view of a display apparatus according to another embodiment of the present disclosure.

FIG. 12 is a cross-sectional view of a display apparatus according to another embodiment of the present disclosure, wherein the configuration of the first source electrode S1 is different from that of FIG. 11 described above.

In the case of FIG. 11 described above, the second part S12 of the first source electrode S1 contacts the upper surface of the light shielding layer LS and does not contact the first active layer A1 and the connection layer CL.

On the other hand, in the case of FIG. 12, the second part S12 of the first source electrode S1 contacts the upper surface of the light shielding layer LS, and also contacts one side surface of the first active layer A1 and one side surface of the connection layer CL. For example, the second part S12 of the first source electrode S1 is in contact with one end of the first connection part A1$a$ and with one end of the other portion of the connection layer CL.

Accordingly, the movement path of electrons in FIG. 12 can be shorter than the movement path of electrons in FIG. 11.

FIGS. 13A to 13H are cross-sectional views of a manufacturing process of a display apparatus according to an embodiment of the present disclosure.

Figure 13A:
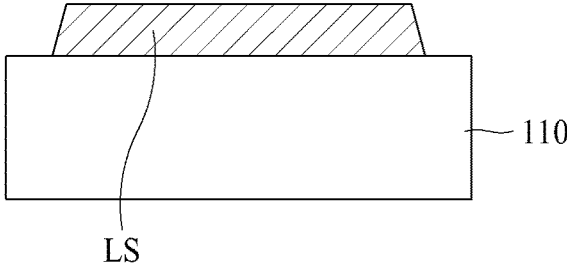
FIGS. 13A to 13H are cross-sectional views of a manufacturing process of a display apparatus according to an embodiment of the present disclosure.

First, as shown in FIG. 13A, a light shielding layer LS is patterned on the first insulating layer 110.

Figure 13B:
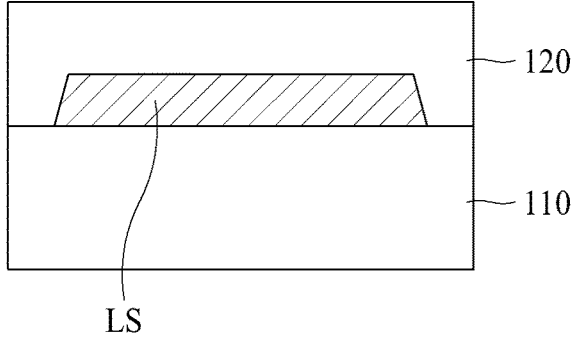

Next, as shown in FIG. 13B, a second insulating layer 120 is formed on the light shielding layer LS.

Figure 13C:
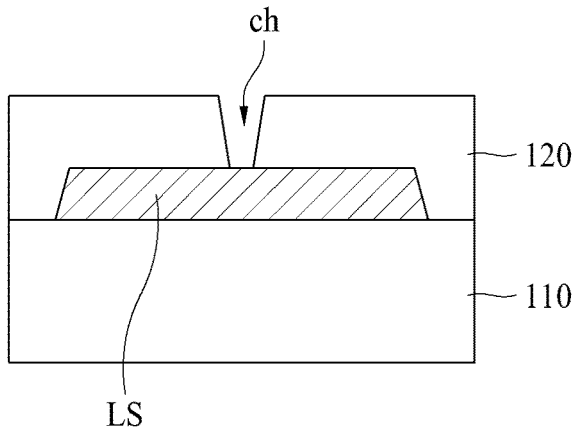

Next, as shown in FIG. 13C, a contact hole ch is formed in the second insulating layer 120.

Figure 13D:
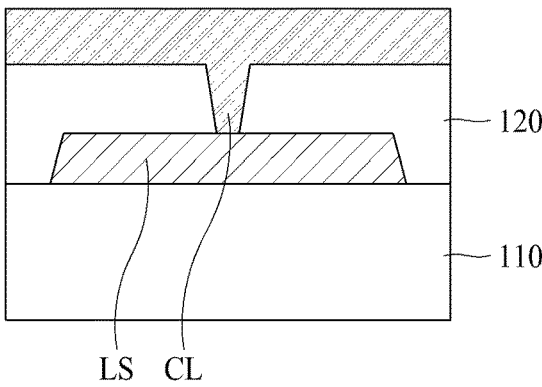

Next, as shown in FIG. 13D, a connection layer CL is formed on the second insulating layer 120 including the inside of the contact hole ch. The connection layer CL can be made of, or include the same material as the first active layer A1 to be described later, or can be made of, or include the same material as the light shielding layer LS.

Figure 13E:
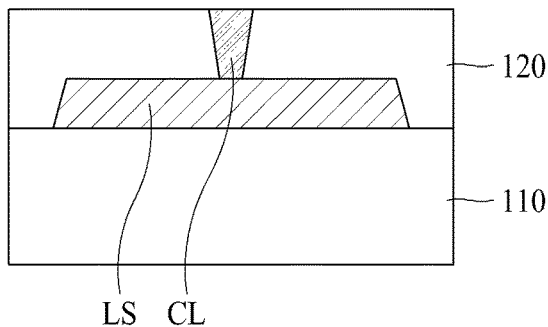

Next, as shown in FIG. 13E, the connection layer CL formed outside the contact hole ch is removed, and the connection layer CL formed inside the contact hole ch is left.

Figure 13F:
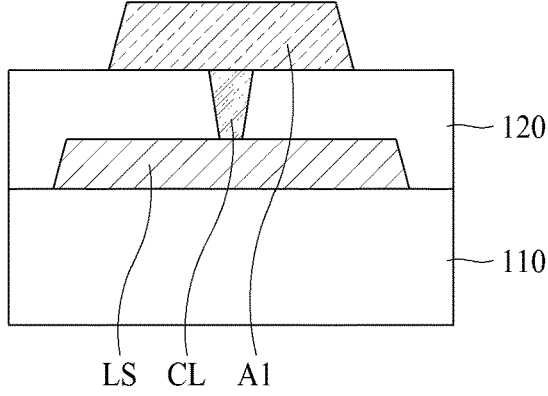

Next, as shown in FIG. 13F, a first active layer A1 is patterned on the connection layer CL.

Figure 13G:
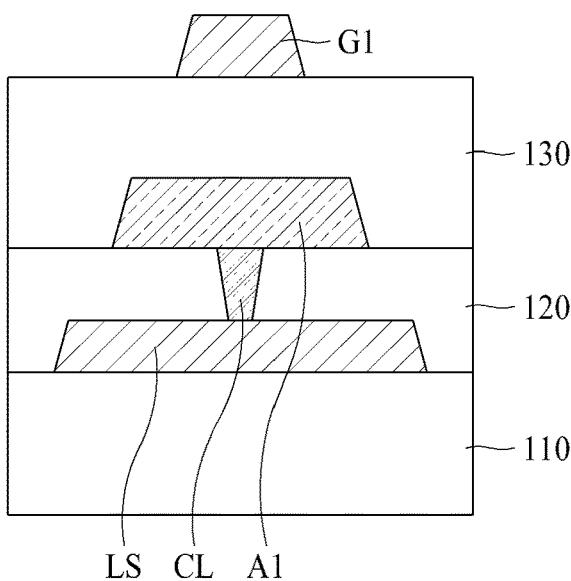

Next, as shown in FIG. 13G, a third insulating layer 130 is formed on the first active layer A1, and a first gate electrode G1 is patterned on the third insulating layer 130. The first gate electrode G1 is formed to overlap a central portion of the first active layer A1.

Figure 13H:
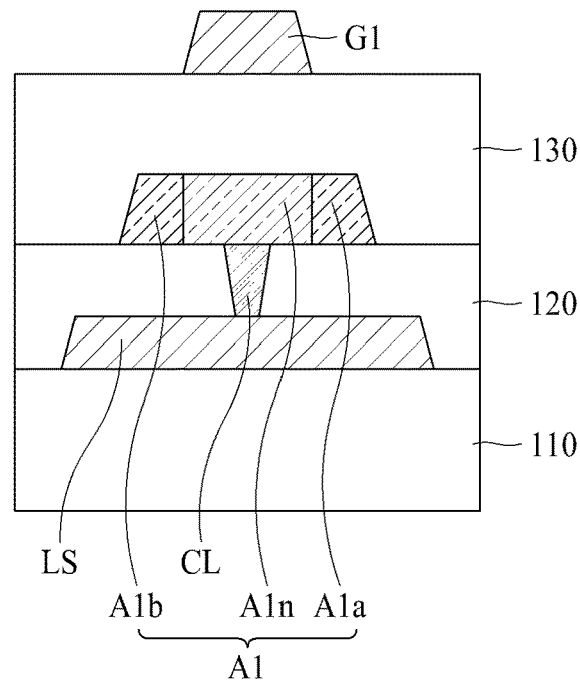

Next, as shown in FIG. 13H, dopants are doped on one side and the other side of the first active layer A1 that are not covered by the first gate electrode G1 using the first gate electrode G1 as a mask. Thus, an undoped channel part A1$n$, a first connection part A1$a$ provided on one side of the channel part A1$n$ doped by a dopant, and a second connection part A1$b$ provided on the other side of the channel part A1$n$ doped by a dopant are formed.

The fourth insulating layer 140 is formed as in the aforementioned embodiments, and a first source electrode S1 and a first drain electrode D1 are formed on the fourth insulating layer 140 to complete the first thin film transistor T1.

Figure 14:
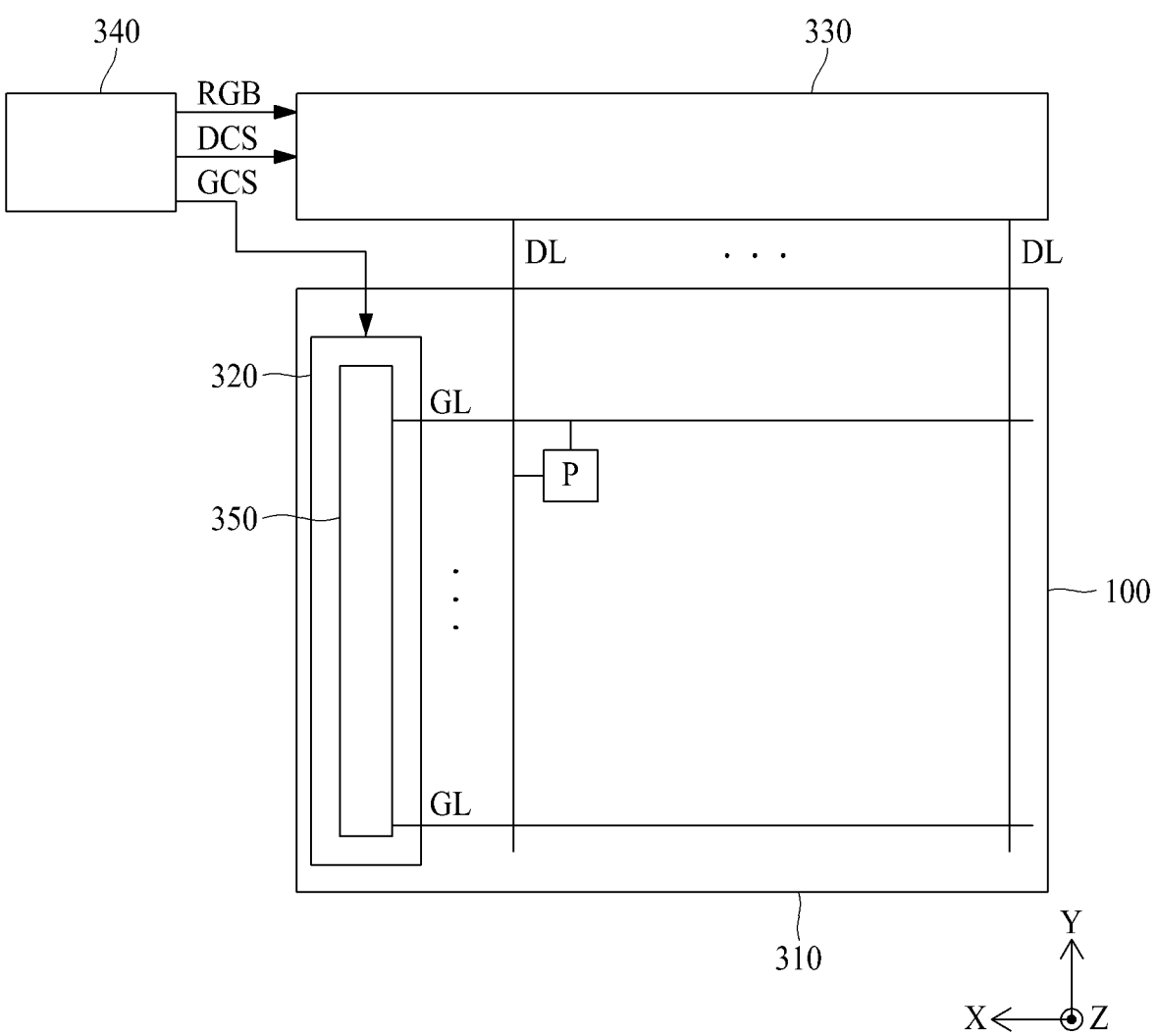
FIG. 14 is a schematic diagram of a display apparatus according to an embodiment of the present disclosure.

FIG. 14 is a schematic diagram of a display apparatus according to an embodiment of the present disclosure.

As shown in FIG. 14, the display apparatus according to an embodiment of the present disclosure can include a display panel 310, a gate driver 320, a data driver 330, and a controller 340.

The display panel 310 includes gate lines GLs and data lines DLs, and pixels P are disposed in respective crossing areas of the gate lines GLs and data lines DLs. An image is displayed by driving the pixel P. The gate lines GLs, the data lines DLs, and the pixels P can be disposed on the substrate 100.

The controller 340 controls the gate driver 320 and the data driver 330. The controller 340 outputs a gate control signal GCS for controlling the gate driver 320 and a data control signal DCS for controlling the data driver 330 by using a signal supplied from an external system. Further, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register can be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 can be mounted on the display panel 310. As described above, a structure in which the gate driver 320 is directly mounted on the display panel 310 is referred to as a gate in panel (GIP) structure. Specifically, in the gate-in-panel (GIP) structure, the gate driver 320 can be disposed on the substrate 100.

The gate driver 320 can include a shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Further, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal GS.

Figure 15:
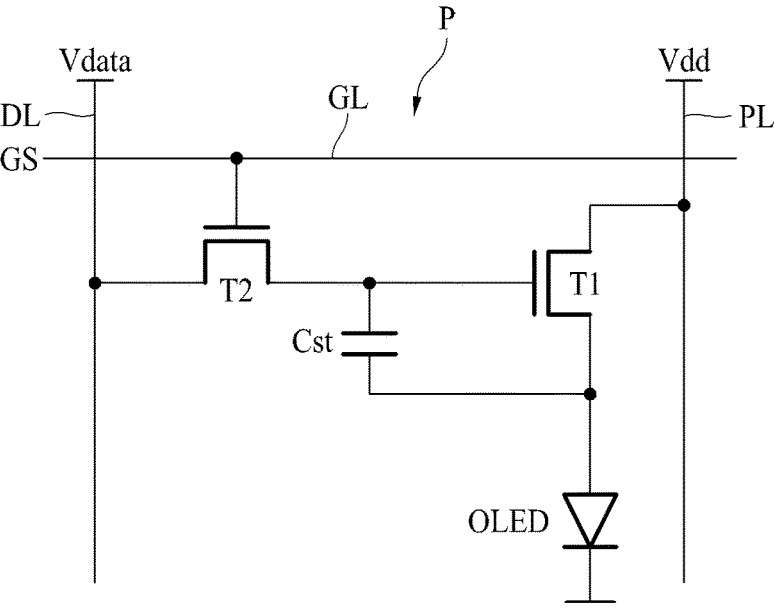
FIG. 15 is a circuit diagram of one pixel provided in a display apparatus according to an embodiment of the present disclosure.

FIG. 15 is a circuit diagram of one pixel provided in a display apparatus according to an embodiment of the present disclosure.

As shown in FIG. 15, the display apparatus according to an embodiment of present disclosure includes first to second thin film transistors T1 and T2 and capacitors Cst.

The first thin film transistor T1 is a driving thin film transistor, and the second thin film transistor T2 is a switching thin film transistor. The first thin film transistor T1 can be formed of, or include a first thin film transistor T1 having a connection layer CL as in various embodiments described above. The second thin film transistor T2 can be formed of, or include the second thin film transistor T2 of FIG. 1 that does not have a connection layer CL, but is not limited thereto. In some cases, the second thin film transistor T2 can also include a connection layer CL.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 16:
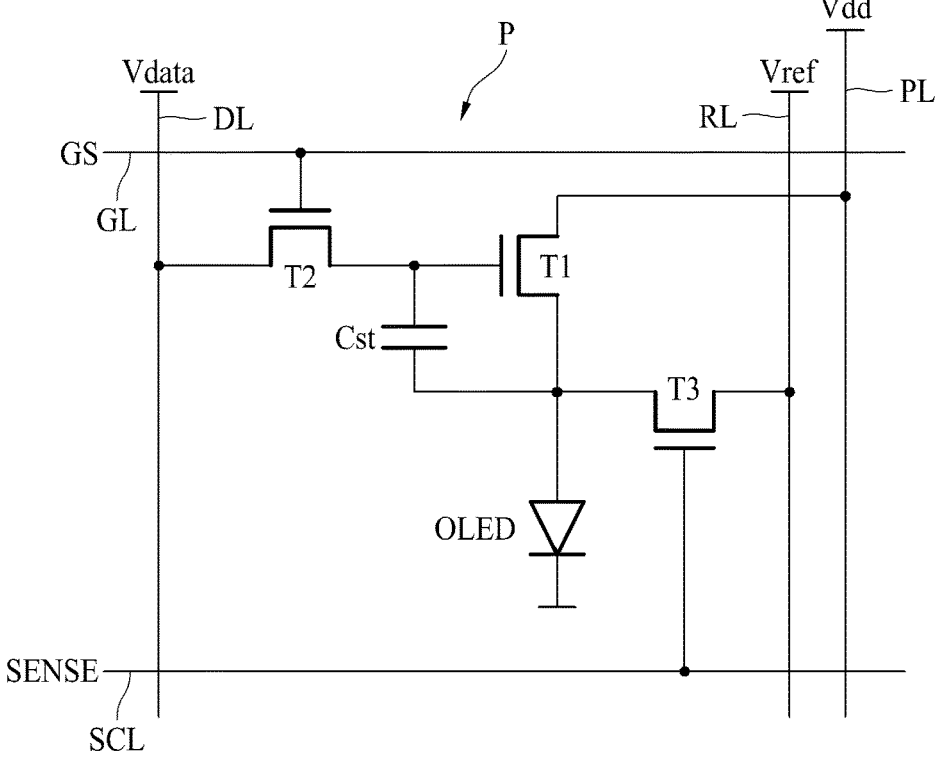
FIG. 16 is a circuit diagram of one pixel provided in a display apparatus according to another embodiment of the present disclosure.

FIG. 16 is a circuit diagram of one pixel provided in a display apparatus according to another embodiment of the present disclosure.

As shown in FIG. 16, the display apparatus according to another embodiment of present disclosure includes first to third thin film transistors T1, T2, T3 and a capacitor Cst.

The first thin film transistor T1 is a driving thin film transistor, and the second to third thin film transistors T2 to T3 are switching thin film transistors. The first thin film transistor T1 can be formed of, or include a first thin film transistor T1 having a connection layer CL as in various embodiments described above. Each of the second to third thin film transistors T2 to T3 can have the same structure as the second thin film transistor T2 of FIG. 1 that does not include the connection layer CL, but is not limited thereto. In some cases, at least one of the second to third thin film transistors T2 to T3 can include a connection layer CL.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 17:
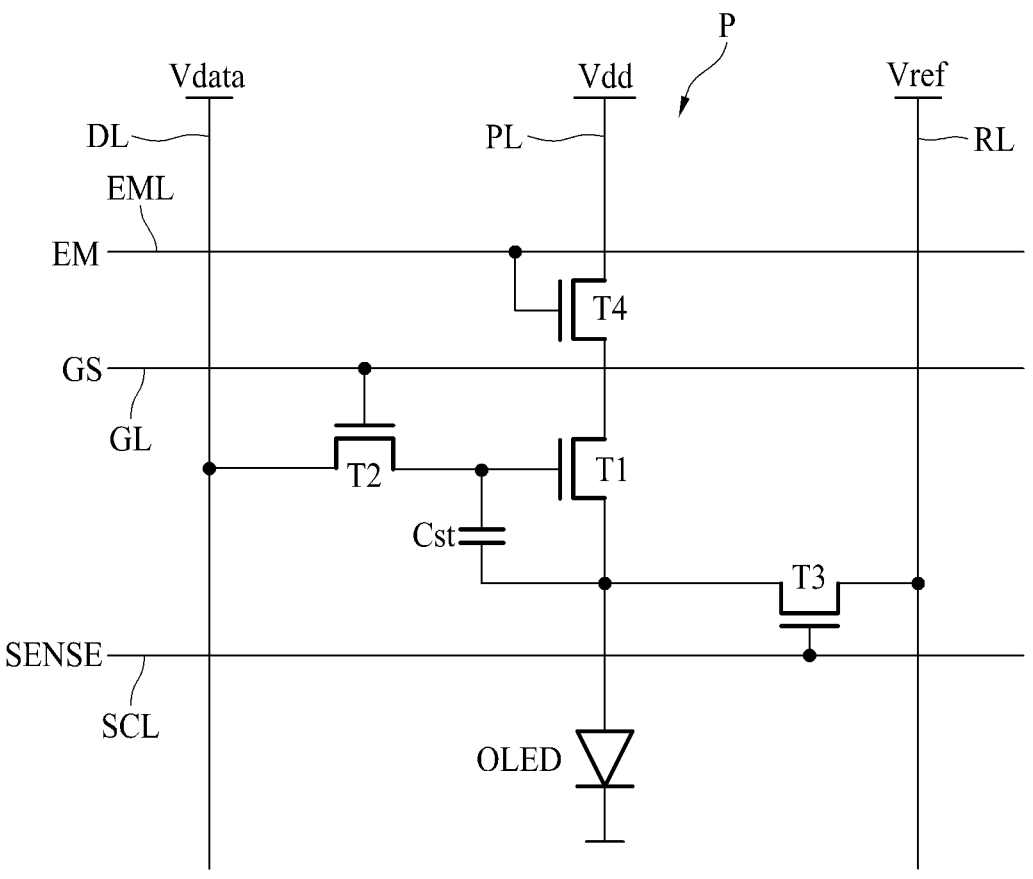
FIG. 17 is a circuit diagram of one pixel provided in a display apparatus according to yet another embodiment of the present disclosure.

FIG. 17 is a circuit diagram of one pixel provided in a display apparatus according to another embodiment of the present disclosure.

As shown in FIG. 17, the display apparatus according to another embodiment of the present disclosure includes first to fourth thin film transistors T1, T2, T3, and T4 and a capacitor Cst.

The first thin film transistor T1 is a driving thin film transistor, and the second to fourth thin film transistors T2 to T4 are switching thin film transistors. The first thin film transistor T1 can be formed of, or include a first thin film transistor T1 having a connection layer CL as in various embodiments described above. Each of the second to fourth thin film transistors T2 to T4 can have the same structure as the second thin film transistor T2 of FIG. 1 that does not include the connection layer CL, but is not limited thereto. In some cases, at least one of the second to fourth thin film transistors T2 to T4 can include a connection layer CL.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The fourth thin film transistor T4 is switched according to the light emission control signal EM supplied to the light emission control line EML and supplies the driving voltage VDD supplied from the power line PL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 18A:
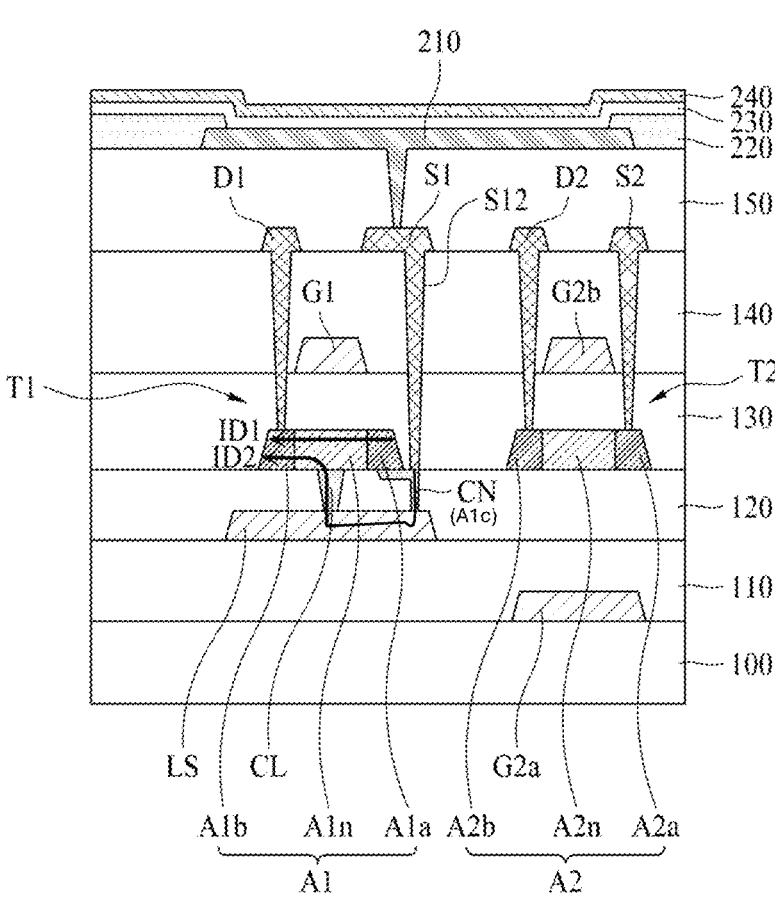
FIGS. 18A and 18B are each a cross-sectional view of a display apparatus according to an embodiment of the present disclosure.
Figure 18B:
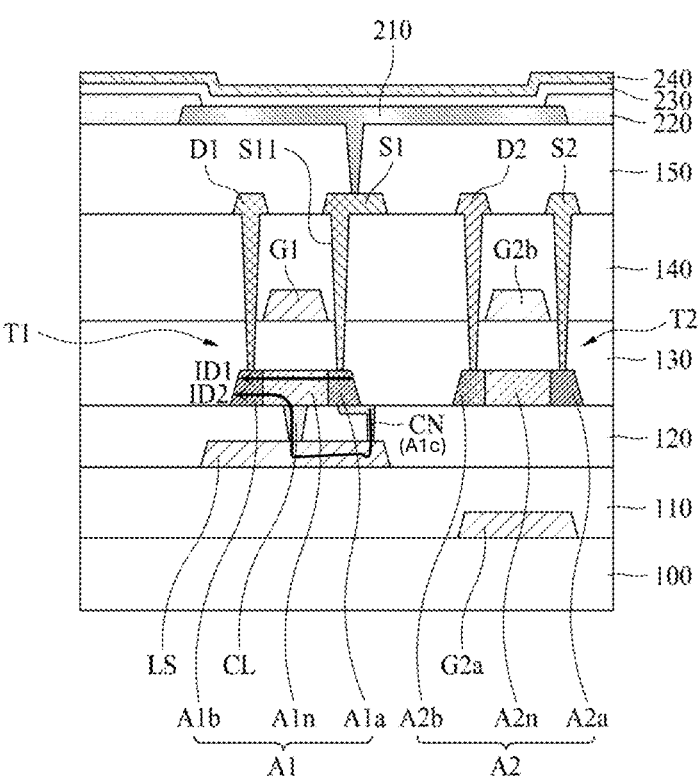
Figure 18C:
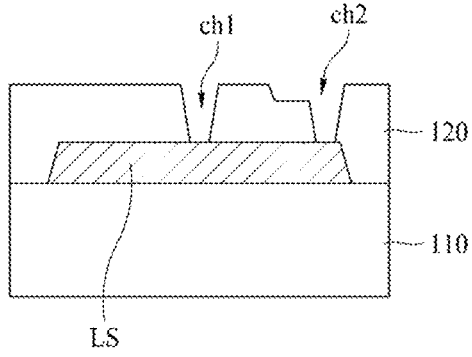
FIG. 18C is a cross-sectional view of one operation during a manufacturing process of a display apparatus according to an embodiment of the present disclosure.

FIGS. 18A and 18B are each a cross-sectional view of a display apparatus according to an embodiment of the present disclosure, and FIG. 18C is a cross-sectional view of one operation during a manufacturing process of a display apparatus according to an embodiment of the present disclosure.

Referring to FIGS. 18A and 18B, in various embodiments of the present disclosure, the first source electrode S1 can have either a first part S11 (FIG. 18B) or a second part S12 (FIG. 18A) instead of having both first and second parts S11, S12. By having only a first part S11 or a second part S12, an amount of a contact hole provided in the third to fourth insulating layers 130 and 140 can be reduced, and any need to keep the first part S11 and the second part S12 separated through the third and fourth insulating layers 130 and 140 is avoided. In embodiments of the present disclosure, when only the first part S11 or the second part S12 is provided, a thickness or diameter of the first part S11 or the second part S12 can be different from that of the first drain electrode D1, but is not limited thereto. For example, the thickness or diameter of the first part S11 or the second part S12 can be the same to that of the first drain electrode D1, but if different, the thickness or diameter of the first part S11 or the second part S12 can be greater than that of the first drain electrode D1.

When only the first part S11 or the second part S12 is provided for the first source electrode S1, a connection from the first part S11 or the second part S12 to the light shielding layer LS can be by way of a connector CN provided through the second insulating layer 120. Referring to FIG. 18C, the connector CN can have a first end that contacts the light shielding layer LS, and a second end that connects to the first source electrode S1 via the first part S11 or the second part S12. The second end of the connector CN can have a pad that is exposed at an upper surface of the second insulating layer 120. The pad can have a surface area that extends horizontally to connected to a bottom of the first active layer A1, at one or both of the undoped channel part A1*n* and the first connection part A1*a*. The second end of the connector having a pad enable selective use of the first part S11 or the second part S12 since use of the first part S11 allows the first source electrode S1 to connect to the first connection part A1*a* via the first part S11, and since use of the second part S12 allows the first source electrode S1 to connect to the connector CN directly.

Referring to FIG. 18C, the pad of the connector CN and the connector CN itself can be formed by forming a second contact hole ch2 at the same time a first connect hole ch1 is formed.

In various embodiments of the present disclosure, the connector CN need not have a pad, and the connector CN can simply be a vertical connector that extends to the light shielding layer LS. Nevertheless, having the pad in the connector CN allows for process tolerance that the second part S12 will communicate with the connector CN during manufacture, and ensures that the connector CN can be electrically contacted with the first connection part A1*a*. Further, in various embodiments of the present disclosure, the pad of the connector CN need not extend towards the first connection part A1*a*, but can be formed to extend away from the first connection part A1*a*. In this example, the connector CN do not contact the first connection part A1*a* while maintaining a larger surface for the second part S12 to be connected to the connector CN by securing process tolerance during manufacture. In this particular instance, an auxiliary connector can be provided to connect the second part S12 to the first connection part A1*a* to ensure the first current path ID1 is provided, but embodiments of the present disclosure is not limited thereto.

Accordingly, the present disclosure can have the following advantages.

According to an embodiment of the present disclosure, since the light shielding layer and the first active layer are electrically connected by the connection layer, there are two paths through which electrons move from the first source electrode to the first drain electrode. Specifically, the path includes a first path from the first source electrode to the first drain electrode via the first active layer, and a second path from the first source electrode to the first drain electrode via the light shielding layer, the connection layer, and the first active layer. As described above, by additionally configuring the second path by the connection layer, the on-current of the thin film transistor can be improved, and a large current can be secured at a low voltage, thereby reducing overheating problems caused by high voltage driving.

According to an embodiment of the present disclosure, since the on-current of the thin film transistor can be improved through the above-mentioned connection layer, the thickness and dielectric constant of the insulating layer can be adjusted to maintain a large S-factor, thereby improving both S-factor and on-current characteristics.

According to an embodiment of the present disclosure, since the first active layer is connected to the light shielding layer by the connection layer, heat generated when the thin film transistor is driven is easily transferred from the first active layer to the light shielding layer, thereby improving heat release effect.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor substrate comprising:
 a light shielding layer including a conductive material;
 an active layer disposed on the light shielding layer and overlapping the light shielding layer;
 a source electrode connected to a first side of the active layer and connected to the light shielding layer;
 a drain electrode connected to a second side of the active layer;
 a gate electrode overlapping the active layer; and
 a connection layer disposed between the light shielding layer and the active layer, and electrically connecting the light shielding layer with the active layer,
 wherein the connection layer is disconnected from the gate electrode and overlaps the gate electrode.

2. The thin film transistor substrate according to claim 1, wherein an upper surface of the connection layer is in contact with a lower surface of the active layer, and
 wherein a lower surface of the connection layer is in contact with an upper surface of the light shielding layer.

3. The thin film transistor substrate according to claim 1, further comprising:
 a buffer layer disposed between the light shielding layer and the active layer; and
 a gate insulating layer disposed between the active layer and the gate electrode,
 wherein a thickness of the buffer layer is thinner than a thickness of the gate insulating layer.

4. The thin film transistor substrate according to claim 1, wherein the source electrode includes a first part in contact with an upper surface of the first side of the active layer and a second part in contact with an upper surface of the light shielding layer.

5. The thin film transistor substrate according to claim 1, wherein the connection layer includes a same material as the active layer, or the light shielding layer.

6. The thin film transistor substrate according to claim 1, further comprising a buffer layer between the active layer and the light shielding layer, wherein the connection layer penetrates through the buffer layer.

7. The thin film transistor substrate according to claim 1, wherein the connection layer is composed of a plurality of connection layers spaced apart from each other.

8. The thin film transistor substrate according to claim 7, wherein the active layer includes a channel overlapping the gate electrode, a first connection part disposed on a first side of the channel and connected to the source electrode, and a second connection part disposed on a second side of the channel and connected to the drain electrode, and wherein the plurality of connection layers include at least one connection layer connecting the light shielding layer with the channel, and at least one other connection layer connecting the light shielding layer with the first connection part.

9. The thin film transistor substrate according to claim 1, wherein the active layer includes a channel overlapping the gate electrode, a first connection part disposed on a first side of the channel and connected to the source electrode, and a second connection part disposed on a second side of the channel and connected to the drain electrode, and wherein a portion of the connection layer connects the light shielding layer with the channel, and an another portion of the connection layer connects the light shielding layer with the first connection part.

10. The thin film transistor substrate according to claim 9, wherein a first end of the another portion of the connection layer is aligned with a first end of the first connection part, or is in contact with the source electrode.

11. The thin film transistor substrate according to claim 1, wherein the active layer includes a channel overlapping the gate electrode, a first connection part disposed on a first side of the channel and connected to the source electrode, and a second connection part disposed on a second side of the channel and connected to the drain electrode, and wherein the connection layer is connected to the channel.

12. The thin film transistor substrate according to claim 11, wherein the connection layer is located closer to the second connection part than to the first connection part.

13. The thin film transistor substrate according to claim 11, wherein the connection layer is spaced apart from the second connection part without contacting the second connection part.

14. A thin film transistor substrate comprising:

an active layer;

a source electrode connected to a first side of the active layer;

a drain electrode connected to a second side of the active layer; and a gate electrode overlapping the active layer, wherein a path of electrons from the source electrode to the drain electrode includes a first path from the source electrode to the drain electrode via the active layer and a second path from the source electrode to the drain electrode through the active layer via a third connection part including a connection layer, wherein the connection layer is disconnected from the gate electrode and overlaps the gate electrode.

15. The thin film transistor substrate according to claim 14, wherein the third connection part includes a light shielding layer connected to the source electrode and overlapping the active layer, and the connection layer connecting the light shielding layer with the active layer.

16. The thin film transistor substrate according to claim 15, wherein the active layer includes a channel overlapping the gate electrode, a first connection part disposed on a first side of the channel and connected to the source electrode, and a second connection part disposed on a second side of the channel and connected to the drain electrode, and wherein the connection layer is not in contact with the second connection part.

17. A display apparatus comprising:

a plurality of pixels on a substrate, each pixel including a driving thin film transistor, wherein the driving thin film transistor comprises:

a light shielding layer on the substrate and including a conductive material;

an active layer overlapping the light shielding layer;

a source electrode electrically connected to at least one of a first side of the active layer and the light shielding layer;

a drain electrode electrically connected to a second side of the active layer;

a gate electrode overlapping the active layer; and a connection layer between the light shielding layer and the active layer, and connecting the light shielding layer to the active layer, wherein the connection layer is disconnected from the gate electrode and overlaps the gate electrode.

18. The display apparatus according to claim 17, further comprising a switching thin film transistor including an active layer disposed on a same layer as the active layer of the driving thin film transistor, wherein a portion of a lower surface of the active layer of the driving thin film transistor is in contact with the connection layer, and another portion of the lower surface of the active layer of the driving thin film transistor is in contact with a buffer layer between the light shielding layer and the active layer of the driving thin film transistor, and wherein an entire lower surface of the active layer of the switching thin film transistor is in contact with the buffer layer.

19. The display apparatus according to claim 17, further comprising:

a connector between the light shielding layer and the active layer, and connecting the light shielding layer to at least one of the first side of the active layer and the source electrode.

20. The display apparatus according to claim 19, wherein the source electrode is connected to the connector, and the connector is connected to both the first side of the active layer and the source electrode.

* * * * *